US009082799B2

(12) United States Patent
Weaver et al.

(10) Patent No.: US 9,082,799 B2
(45) Date of Patent: Jul. 14, 2015

(54) SYSTEM AND METHOD FOR 2D WORKPIECE ALIGNMENT

(71) Applicant: Varian Semiconductor Equipment Associates, Inc., Gloucester, MA (US)

(72) Inventors: William T. Weaver, Austin, TX (US); Charles T. Carlson, Cedar Park, TX (US); Scott A. Smith, Lago Vista, TX (US); Michael A. Beck, Pflugerville, TX (US); Aaron P. Webb, Austin, TX (US); James D. Strassner, Austin, TX (US); Lawrence R. Gravell, Austin, TX (US); Michael C. Simmons, Austin, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 206 days.

(21) Appl. No.: 13/623,428

(22) Filed: Sep. 20, 2012

(65) Prior Publication Data

US 2014/0077431 A1    Mar. 20, 2014

(51) Int. Cl.
*H01L 21/673* (2006.01)
*H01L 21/68* (2006.01)
(Continued)

(52) U.S. Cl.
CPC ........ *H01L 21/67333* (2013.01); *C23C 14/042* (2013.01); *C23C 14/48* (2013.01);
(Continued)

(58) Field of Classification Search
CPC ............ H01L 21/687; H01L 21/68728; H01L 21/68735; H01L 21/68; H01L 21/673; H01L 21/68778; H01L 21/683; H01L 21/6733; C23C 14/50

USPC ......... 269/14, 291, 266, 903, 289 R, 21, 900; 206/565, 725, 726, 722, 1.5
See application file for complete search history.

(56) References Cited

U.S. PATENT DOCUMENTS 3,313,395 A * 4/1967 De Turris et al. ............. 414/787
5,031,547 A * 7/1991 Hirose .......................... 108/140
(Continued)

FOREIGN PATENT DOCUMENTS

| CN | 1366606 | * | 8/2002 | .............. H01L 21/68 |
| EP | 1450398 | * | 8/2004 | ........ H01L 21/68778 |

(Continued)

OTHER PUBLICATIONS

Weaver, William T., et al., High-Throughput Ion Implanter, U.S. Appl. No. 13/662,110, filed Oct. 26, 2012.
(Continued)

*Primary Examiner* — Joseph J Hail
*Assistant Examiner* — Arman Milanian

(57) ABSTRACT

A carrier capable of holding one or more workpieces is disclosed. The carrier includes movable projections located along the sides of each cell in the carrier. This carrier, in conjunction with a separate alignment apparatus, aligns each workpiece within its respective cell against several alignment pins, using a multiple step alignment process to guarantee proper positioning of the workpiece in the cell. First, the workpieces are moved toward one side of the cell. Once the workpieces have been aligned against this side, the workpieces are then moved toward an adjacent orthogonal side such that the workpieces are aligned to two sides of the cell. Once aligned, the workpiece is held in place by the projections located along each side of each cell. In addition, the alignment pins are also used to align the associated mask, thereby guaranteeing that the mask is properly aligned to the workpiece.

12 Claims, 14 Drawing Sheets

(51) Int. Cl.
  *H01L 21/687* (2006.01)
  *C23C 14/04* (2006.01)
  *C23C 14/48* (2006.01)
  *C23C 14/50* (2006.01)

(52) U.S. Cl.
  CPC ......... *C23C 14/50* (2013.01); *H01L 21/68728* (2013.01); *H01L 21/68735* (2013.01); *H01L 21/68778* (2013.01); *Y10T 29/49899* (2015.01)

(56) References Cited

U.S. PATENT DOCUMENTS

| | | | | |
|---|---|---|---|---|
| 5,203,452 A * | 4/1993 | Small et al. | ............. | 206/725 |
| 5,350,427 A * | 9/1994 | Freytsis et al. | ............. | 29/25.01 |
| 5,400,904 A * | 3/1995 | Maston et al. | ............. | 206/725 |
| 5,471,279 A * | 11/1995 | Takizawa | ............. | 355/73 |
| 5,584,717 A * | 12/1996 | Radde et al. | ............. | 439/330 |
| 5,817,156 A * | 10/1998 | Tateyama et al. | ............. | 29/25.01 |
| 5,848,670 A * | 12/1998 | Salzman | ............. | 187/272 |
| 5,853,169 A * | 12/1998 | Hern et al. | ............. | 269/21 |
| 5,971,156 A * | 10/1999 | Slocum et al. | ............. | 206/724 |
| 6,146,504 A * | 11/2000 | Patadia et al. | ............. | 204/192.12 |
| 6,711,797 B1 * | 3/2004 | Bennett et al. | ............. | 29/281.6 |
| 7,104,535 B2 * | 9/2006 | Kurita et al. | ............. | 269/303 |
| 7,172,184 B2 * | 2/2007 | Pavani et al. | ............. | 269/37 |
| 7,888,249 B2 | 2/2011 | Bateman et al. | | |
| 8,216,923 B2 | 7/2012 | Bateman et al. | | |
| 8,222,053 B2 | 7/2012 | Sullivan et al. | | |
| 8,330,128 B2 | 12/2012 | Vopat et al. | | |
| 2003/0161706 A1 * | 8/2003 | Kurita et al. | ............. | 414/217 |
| 2005/0092438 A1 * | 5/2005 | Hur et al. | ............. | 156/345.47 |
| 2006/0144738 A1 | 7/2006 | Han et al. | | |
| 2006/0207508 A1 * | 9/2006 | Leung | ............. | 118/728 |
| 2010/0230885 A1 * | 9/2010 | Di Stefano | ............. | 269/303 |
| 2012/0043712 A1 | 2/2012 | Weaver et al. | | |

FOREIGN PATENT DOCUMENTS

| | | | | |
|---|---|---|---|---|
| EP | 2409937 | * | 7/2011 | ........... B65G 49/061 |
| JP | WO2005098935 | * | 10/2005 | ........ H01L 21/68778 |
| JP | 2010-103226 A | | 5/2010 | |
| WO | WO 0250863 A1 * | | 6/2002 | ............. H01J 37/20 |

OTHER PUBLICATIONS

International Search Report and Written Opinion mailed Oct. 7, 2013 for PCT/US2013/050886 filed Jul. 17, 2013.

* cited by examiner

SYSTEM AND METHOD FOR 2D WORKPIECE ALIGNMENT

STATEMENT REGARDING FEDERALLY SPONSORED RESEARCH OR DEVELOPMENT

This Invention was made with U.S. Government support under Contract No. DE-EE0004737 awarded by the Department of Energy. The Government has certain rights in this invention.

BACKGROUND

Workpiece processing, such as solar cell or semiconductor wafer processing, requires a plurality of steps to achieve the finished product. In some embodiments, the workpiece must be moved from a station which performs one of these steps to another station which performs a different step. In some cases, the workpiece is placed in a carrier, which holds and protects the workpiece during these transitions.

However, these carriers are often constructed such that they hold or envelop the edges of the workpieces, thereby covering at least a portion of the workpiece. As a consequence, in some cases, the workpiece typically must be removed from the carrier to be processed, adding time and complexity to the process. In those cases where processing is performed on the workpiece while in the carrier, additional steps are often required to insure that the edges, which were blocked or obscured by the carrier, receive the same treatments as the remainder of the workpiece. Again, these extra steps add time and complexity to the process. Furthermore, in some cases, the edges of the workpiece that are covered during the processing may not be treated in another process step, reducing the efficiency or performance of the workpiece.

Additionally, during workpiece processing, it is often necessary to place a mask in front or on top of the workpiece to limit the exposure of the workpiece to energy, typically in the form of ions or light. This mask must be precisely aligned to the workpiece to insure that the workpiece is properly processed. Unfortunately, this critical alignment may be compromised by various forms of errors, such as thermal expansion of the mask or other materials that are not thermally matched with regard to the coefficient of thermal expansion (CTE) during processing, misalignment of the mask to the workpiece, general tolerance stack ups, workpiece irregularities, and other issues.

Therefore, it would be beneficial if there were a carrier that could be used to hold a workpiece, such that the carrier did not block or obscure the edges of the workpiece, thereby allowing complete processing of the workpiece while in the carrier. Furthermore, it would be beneficial if this carrier facilitated the alignment of a mask to the workpiece. Still further, it would be advantageous if this carrier were able to hold a plurality of workpieces and a plurality of masks, each associated with one of the workpieces.

SUMMARY

A carrier capable of holding a plurality of workpieces is disclosed. The carrier is divided into a plurality of bounded regions, called cells, which each hold one workpiece. The carrier includes movable projections located along the sides of each cell. This carrier, in conjunction with a separate alignment apparatus, aligns each workpiece within its respective cell against several alignment pins, using a multiple step alignment process to guarantee proper positioning of the workpiece in the cell. First, the workpieces are moved toward one side of the cell. Once the workpieces have been aligned against this side, the workpieces are then moved toward an adjacent orthogonal side such that the workpieces are aligned to two sides of the cell. Once aligned, the workpiece is held in place by the projections located along each side of each cell, which press against the edges of the workpiece. These projections hold the workpiece without obscuring the edges, the top surface or the bottom surface of the workpiece that is to be processed. In addition, the alignment pins, to which the workpiece is aligned, are also used to align the associated mask, thereby guaranteeing that the mask is properly aligned to the workpiece.

The alignment apparatus includes a first set of actuators that cause the carrier to move each of the workpieces toward a side of the cell. The alignment apparatus also includes a second set of actuators, operative after the first set of actuators, which cause the carrier to align the workpieces toward a second adjacent orthogonal side of the cell. The alignment apparatus may also include another set of actuators which can be used to lift and lower the workpieces to the carrier.

DETAILED DESCRIPTION

Figure 1:
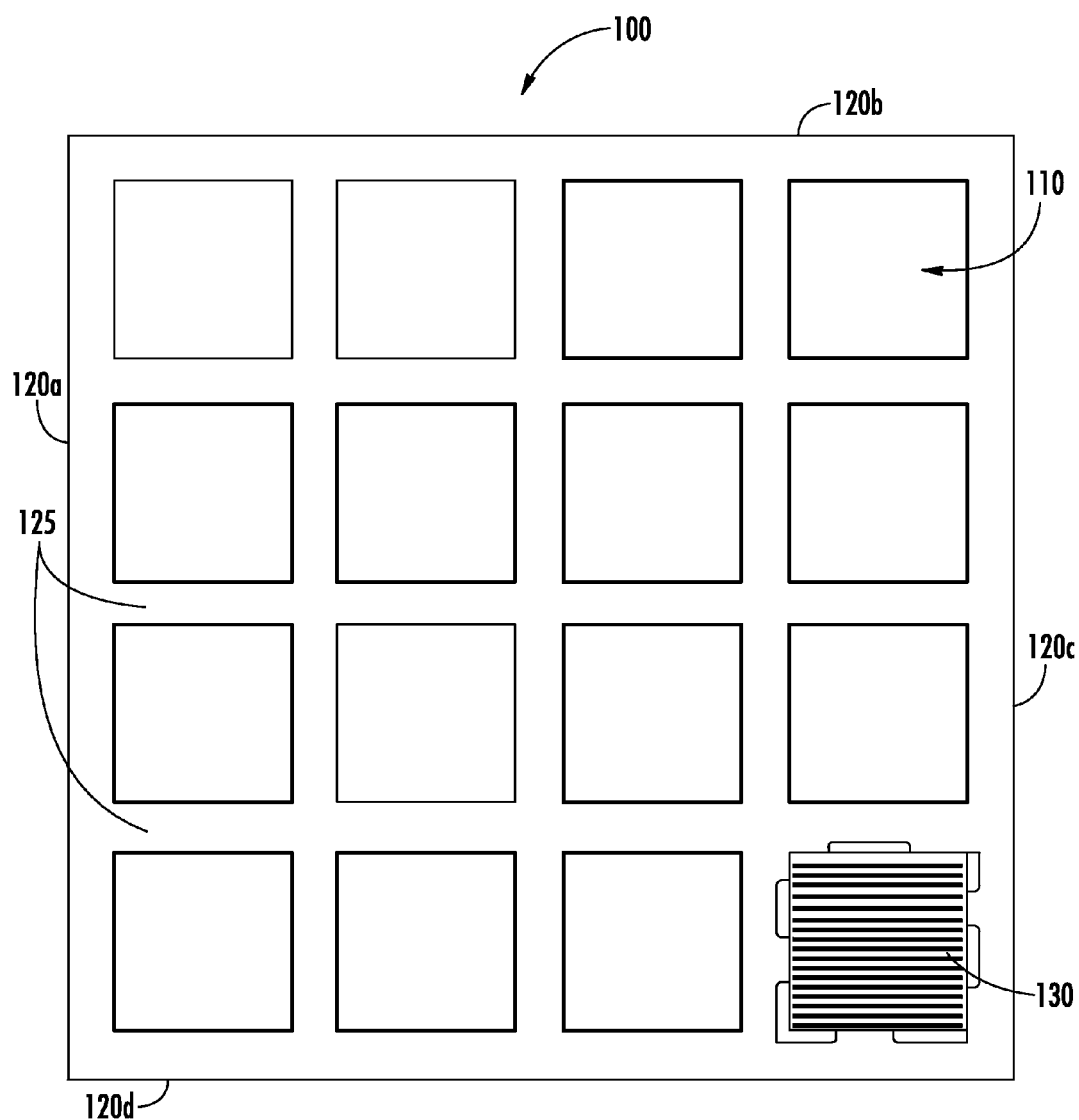
FIG. 1 shows a perspective view of a carrier according to one embodiment.

FIG. 1 shows one embodiment of the carrier 100. This embodiment shows 16 cells 110, grouped as a 4×4 matrix. However, other configurations and cell quantities are within the scope of the invention. The carrier 100 includes four outer walls 120a-d and a plurality of inner walls 125. These outer walls and inner walls are arranged in a grid pattern, where the area between intersecting walls defines a cell 110. The number of inner walls 125 helps determine the number of cells 110 in the carrier 100. Of course, if only one cell 110 is required, no inner walls 125 are needed.

The upper surface of the outer walls 120a-d and inner walls 125, also referred to as cladding, is preferably constructed of graphite to minimize contamination caused by sputtering. The interior frame of the carrier 100, the components within the interior frame, and any surfaces that are not exposed to ion implantation may be constructed of a different material, such as aluminum. FIG. 1 also shows a mask 130 positioned on one of the cells 110.

Figure 2:
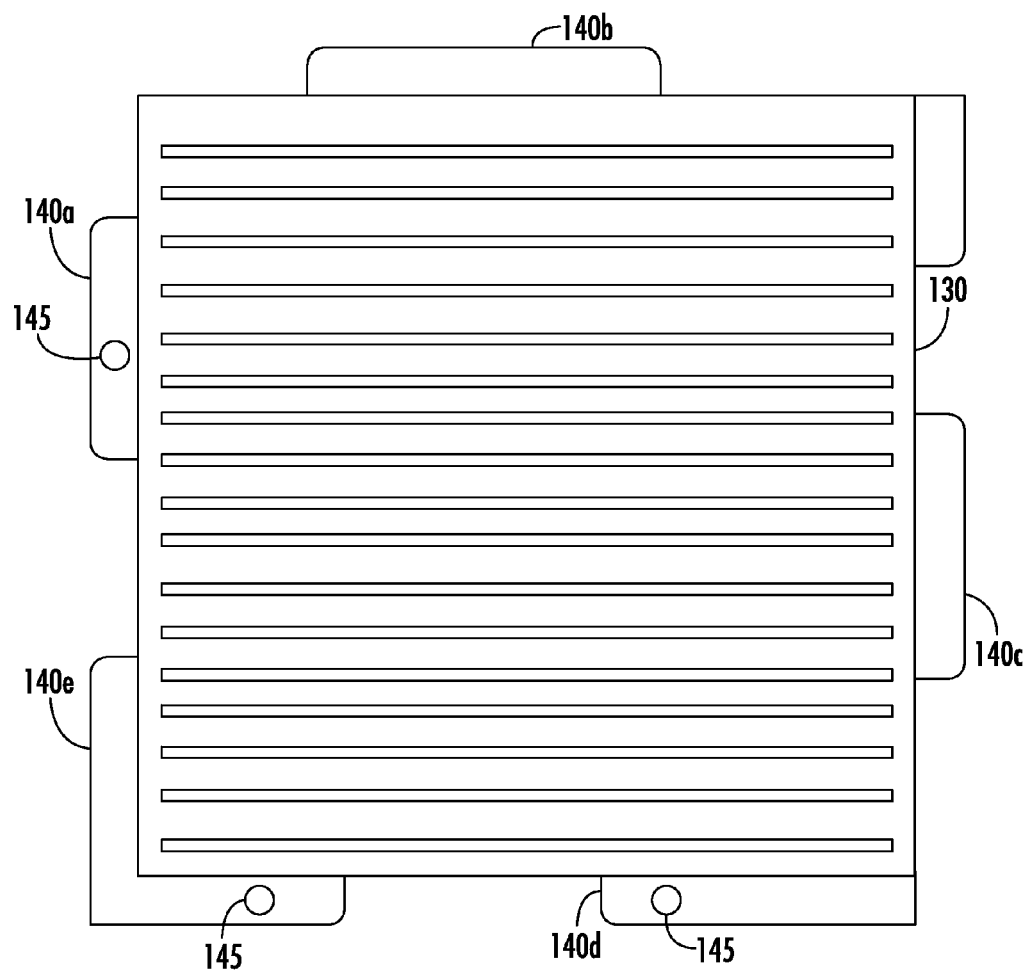
FIG. 2 shows an enlarged view of a mask to be used with the carrier of FIG. 1.

FIG. 2 is an enlarged view of the mask 130 shown in FIG. 1. The mask 130 includes shoulders 140a-e, which rest atop the outer walls 120a, 120d and the inner walls 125 (see FIG. 1). In some embodiments, the mask 130 is a monolithic graphite machined component. Located on several of the shoulders 140a, 140d, 140e are mask locating features 145. These mask locating features 145 may be constructed of silicon carbide and pressed into corresponding holes located in the shoulders 140a, 140d, 140e of the mask 130. These mask locating features 145 are machined based on the master module layout datums in order to insure that each mask 130 accurately and repeatedly aligns to each cell 110 even during elevated heat environments.

Figure 3:
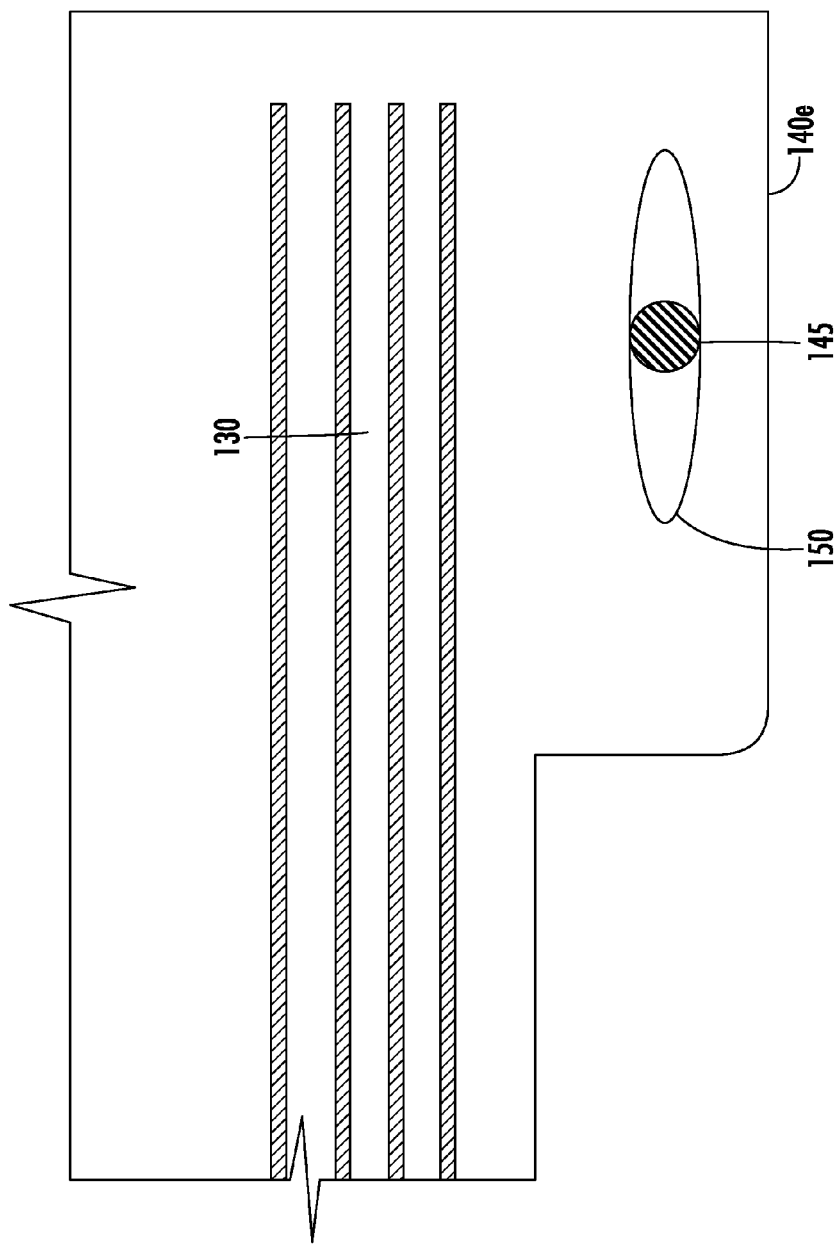
FIG. 3 shows a detail of one of the mask alignment features located on a mask that can be installed in a cell of the carrier.

FIG. 3 shows a bottom view of the mask 130 of FIG. 2. This figure is enlarged so that the lower surface of shoulder 140d can be seen. Designed into this shoulder 140d is one or more elongated depressions 150, or V-grooves. The bottom of a mask locating feature 145 is visible and is located within a respective elongated depression 150 or V-groove. The alignment pins (see FIG. 4) fit into these elongated depressions 150 and align to the mask locating features 145. Other shoulders 140 may also have one or more elongated grooves and mask locating features.

Figure 4:
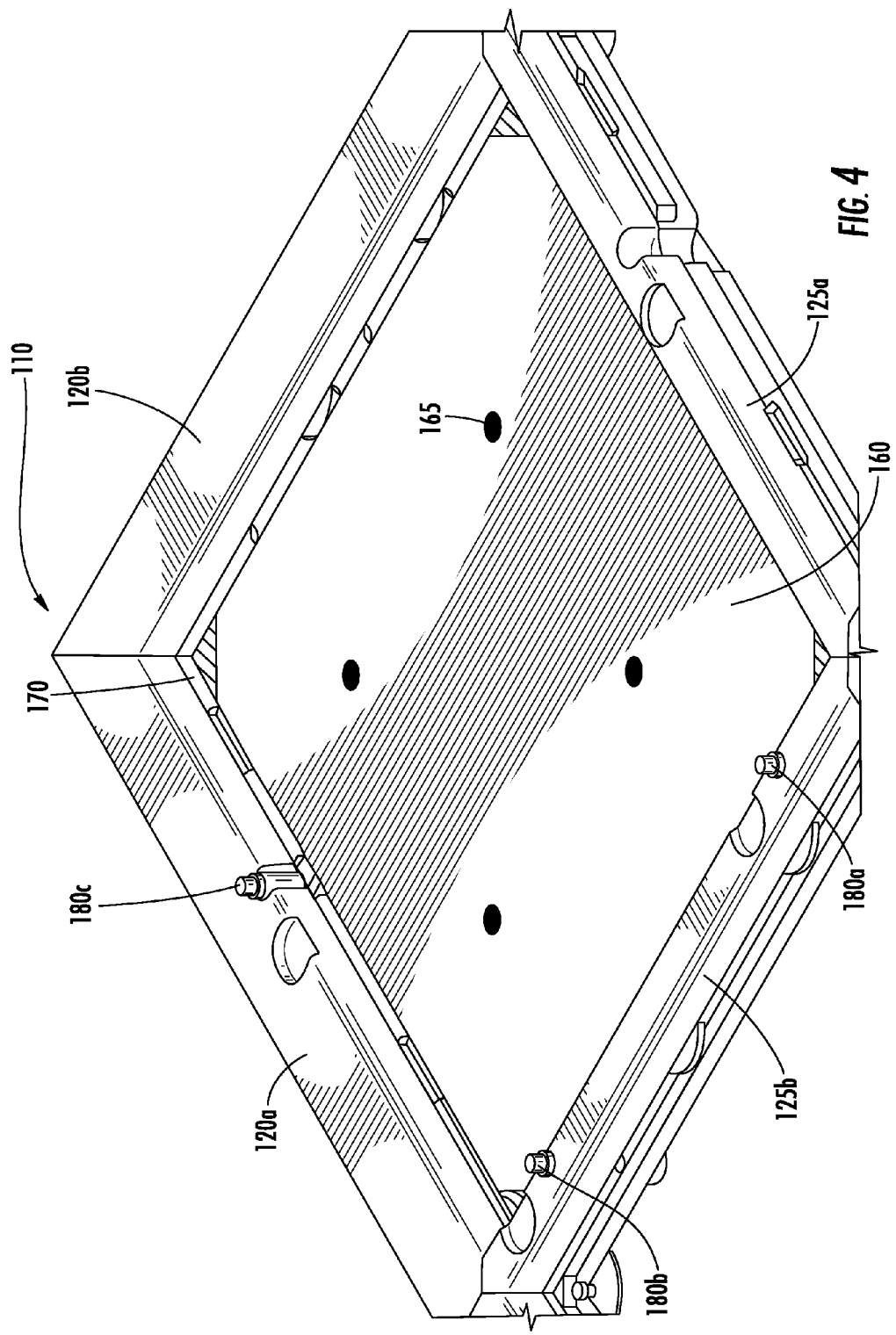
FIG. 4 shows an enlarged view of one cell of the carrier with the mask removed.

FIG. 4 shows an enlarged view of a cell 110 without a mask 130 installed. Portions of outer walls 120a,b and inner walls 125a,b form the perimeter of cell 110. Located at the bottom surface of the cell 110 within the perimeter of the cell 110 is a platen 160. The platen 160 may be an electrostatic chuck, as is known in the art. The platen 160 may have one or more openings 165 in it, which allow a set of lift pins to extend through the platen 160 to lift the workpiece, as described in more detail below.

Along the outer edges of the platen 160 (i.e. those portions nearest to the perimeter) may be shielding 170, which insures that the platen 160 is not exposed to the ions during implantation. This may occur if the area occupied by the workpiece is slightly smaller than the area defined by the perimeter of cell 110. This shielding 170 may be graphite to lower the risk of contamination. Located along inner wall 125b are two alignment pins 180a,b. A third alignment pin 180c is located along outer wall 120a. These three pins 180a-c are located on the perimeter and serve to align the workpiece within the cell 110. These pins also serve to align the mask 130, via the mask locating features 145 illustrated in FIGS. 2-3 that mate with these alignment pins 180a-c. While three alignment pins 180a-c are shown, a different number of alignment pins may be used. For example, two alignment pins may be located along outer wall 120a.

Figure 5:
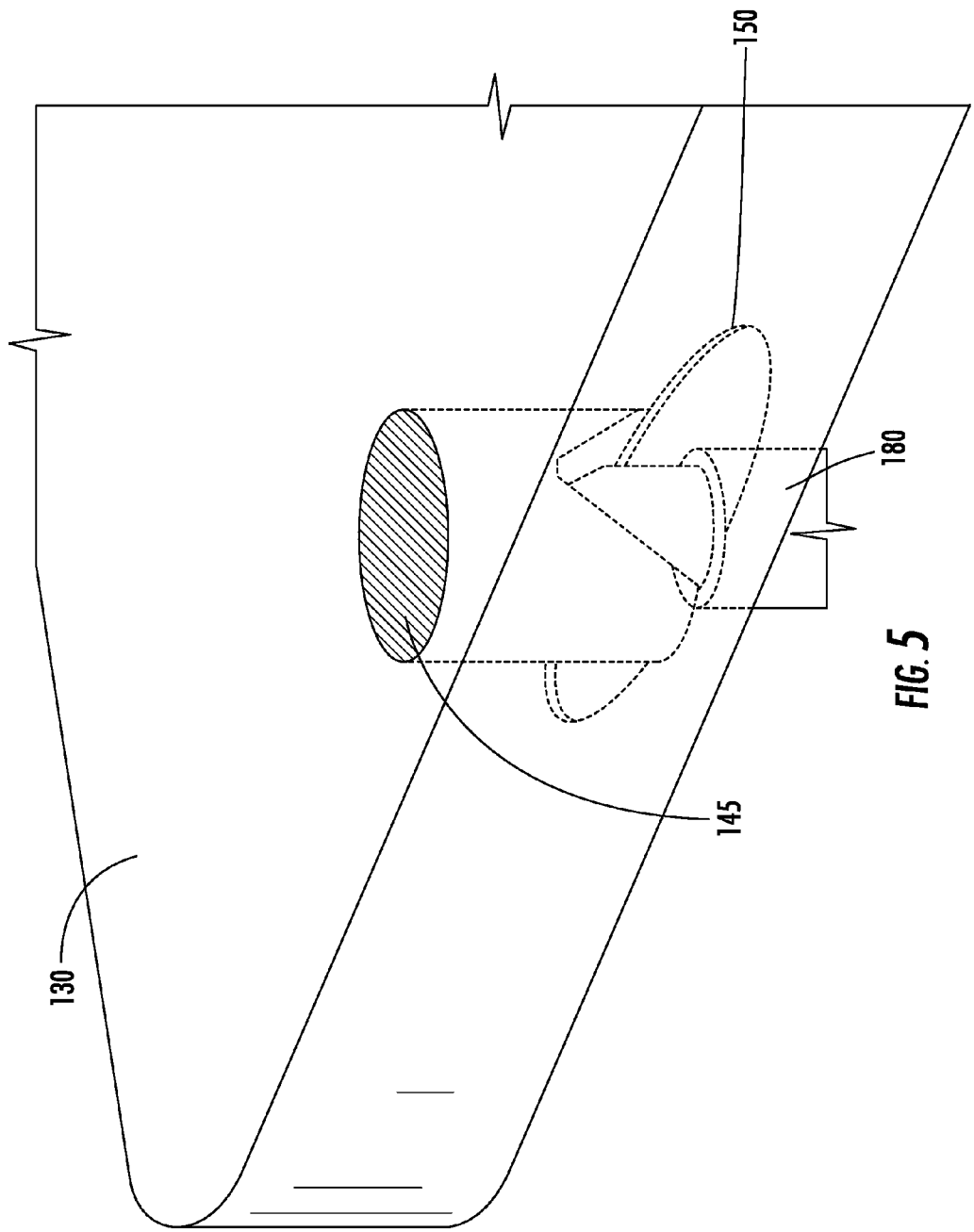
FIG. 5 shows an enlarged view of the cell alignment pin engaged with the mask alignment feature.

FIG. 5 shows an enlarged view of the alignment pin 180 engaged with shoulder 140 of the mask 130. The mask 130 is shown as transparent so the interaction between the mask 130 and the alignment pin 180 can be shown. The mask locating feature 145 is disposed within the elongated depression 150, as described above. When the mask is engaged with the carrier 100, the alignment pin 180 is positioned within the mask locating feature 145.

Figure 6:
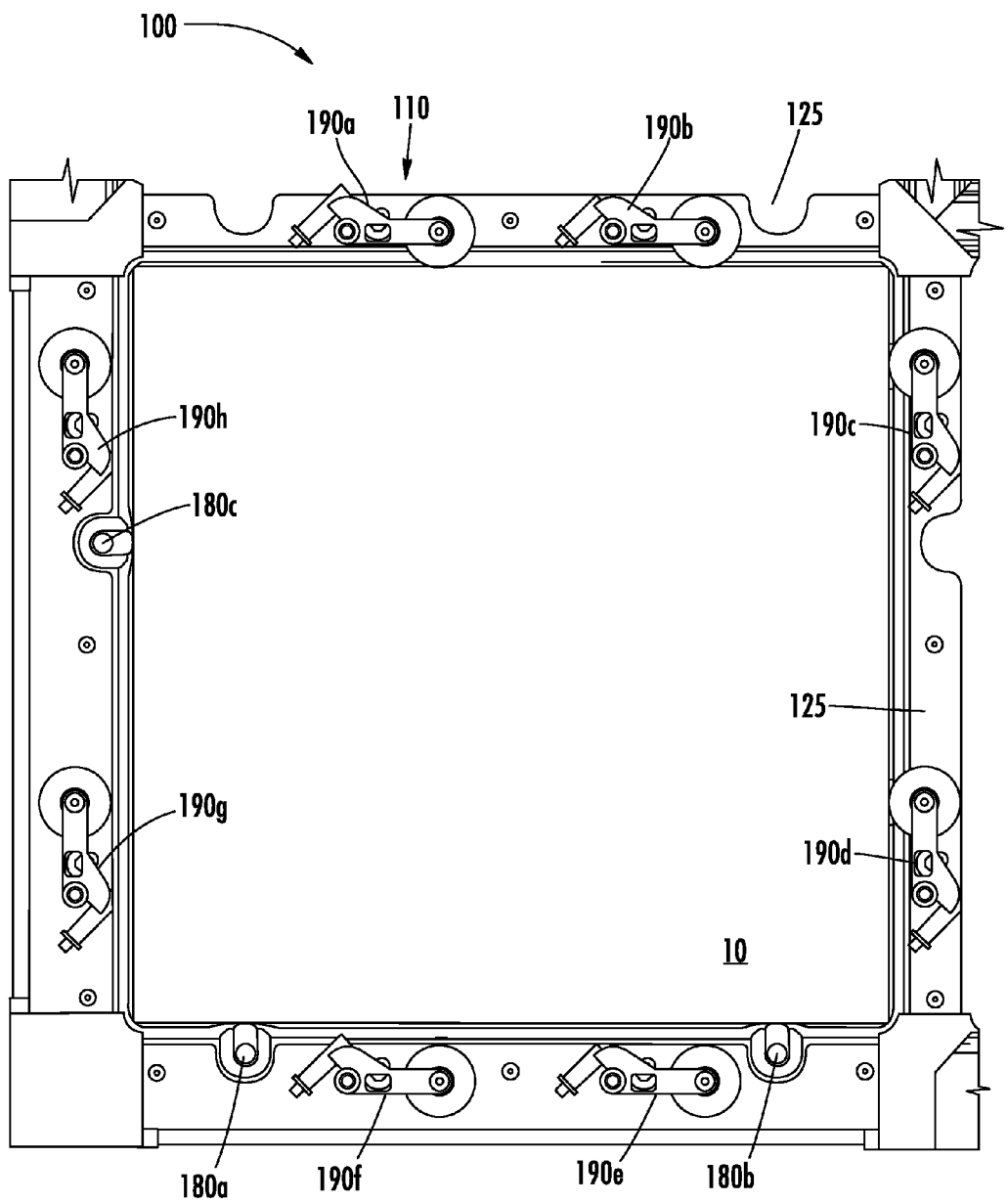
FIG. 6 shows a workpiece after alignment.

FIG. 6 shows an enlarged view of a cell 110 with the graphite cladding removed to allow visibility into the internal components of the carrier 100. Located under the graphite cladding are the mechanisms used to align the workpiece 10 to the alignment pins 180a-c of the cell 110. Located along each side of the cell 110 are one or more movable projections 190, which operate to move the workpiece 10 when actuated. The movable projections 190 may be any suitable device, such as pegs or wheels. These movable projections 190 are each naturally biased through the use of a biasing member, such as a spring, elastic band, or the like. FIG. 6 shows two such movable projections 190 located on each side of the cell 110. In one embodiment, movable projections 190a,b are inwardly biased, so as to move the projections toward the interior of cell 110. Similarly, movable projections 190c,d are also inwardly biased. In contrast, the remaining movable projections 190e-h are all outwardly biased, so that they move away from the cell 110. The terms "inward" and "outward" are referenced to the interior of the cell of interest. Movable projections 190 located on opposite sides of the perimeter are biased in the opposite way. In some embodiments, the movable projections 190 located along those sides on which the alignment pins 180 are disposed are naturally outwardly biased, while the remaining movable projections 190 are naturally inwardly biased. Of course, other biasing configurations are possible.

While movable projections 190 are shown along each side of the perimeter of the cell 110, other embodiments are possible. For example, in some embodiments, movable projections 190 are only located on those sides opposite the sides where the alignment pins 180 are disposed.

In some embodiments, such as that shown in FIG. 6, the movable projections 190 located along the inner walls 125, such as movable projections 190a-d may be used for two adjacent cells 110. In other words, movable projections 190a-d would also serve as movable projections for an adjacent cell. In other embodiments, each cell 110 may have dedicated movable projections 190.

Figure 7:
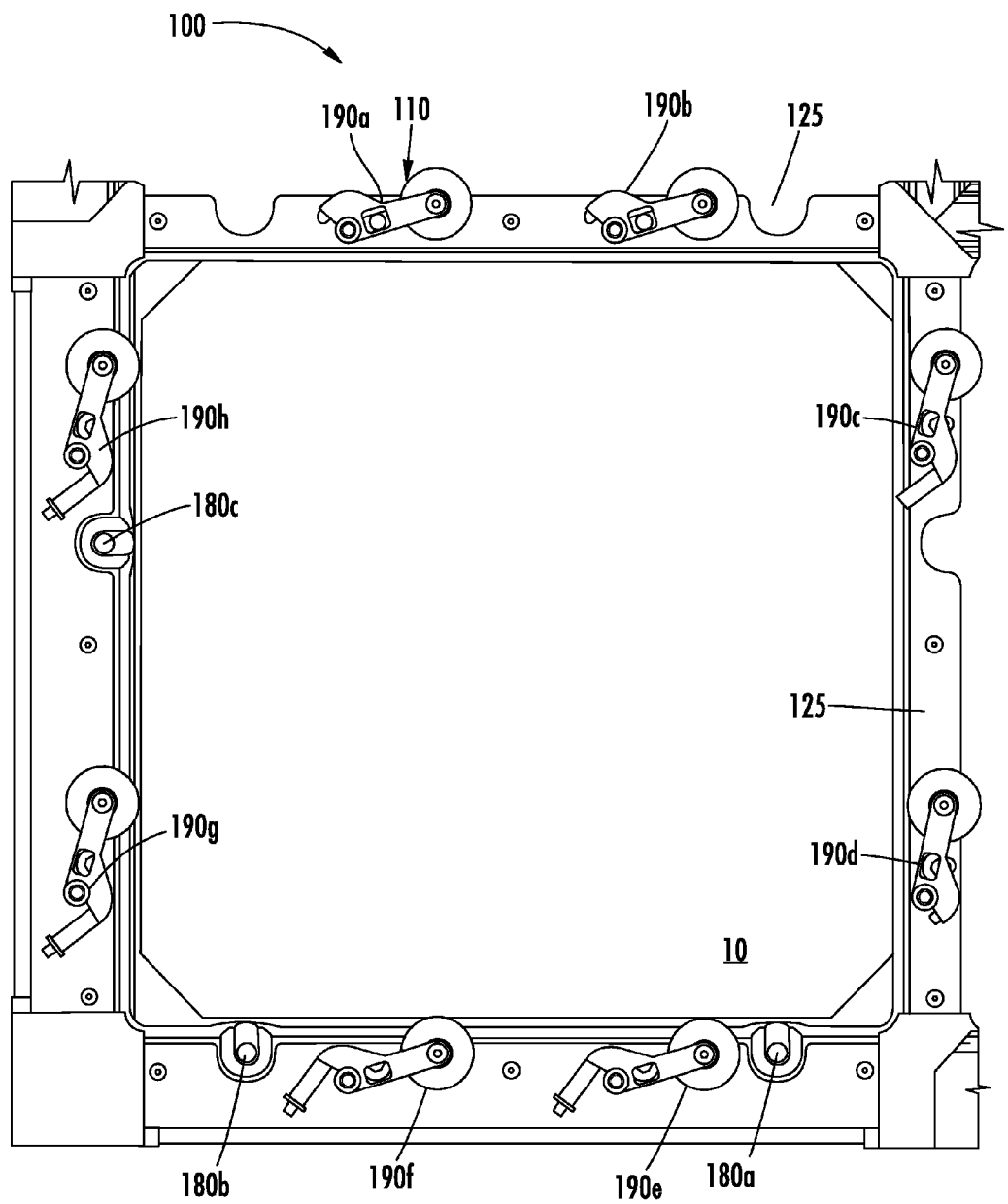
FIG. 7 shows a workpiece in a cell prior to alignment.

In operation, as shown in FIG. 7, to place the workpiece 10 in the carrier 100, the movable projections 190 are all actuated so as to overcome their natural biased position. In other words, movable projections 190a-d are outwardly biased, while movable projections 190e-h are inwardly biased. This allows the workpiece to be placed on the platen 160. Note that movable projections 190a,b are outwardly biased with respect to cell 110, but would be inwardly biased relative to an adjacent cell 110. Thus, these movable projections can be operative in two adjacent cells 110. In this position, the workpiece 10 is not being pressed toward the alignment pins 180.

Figure 8:
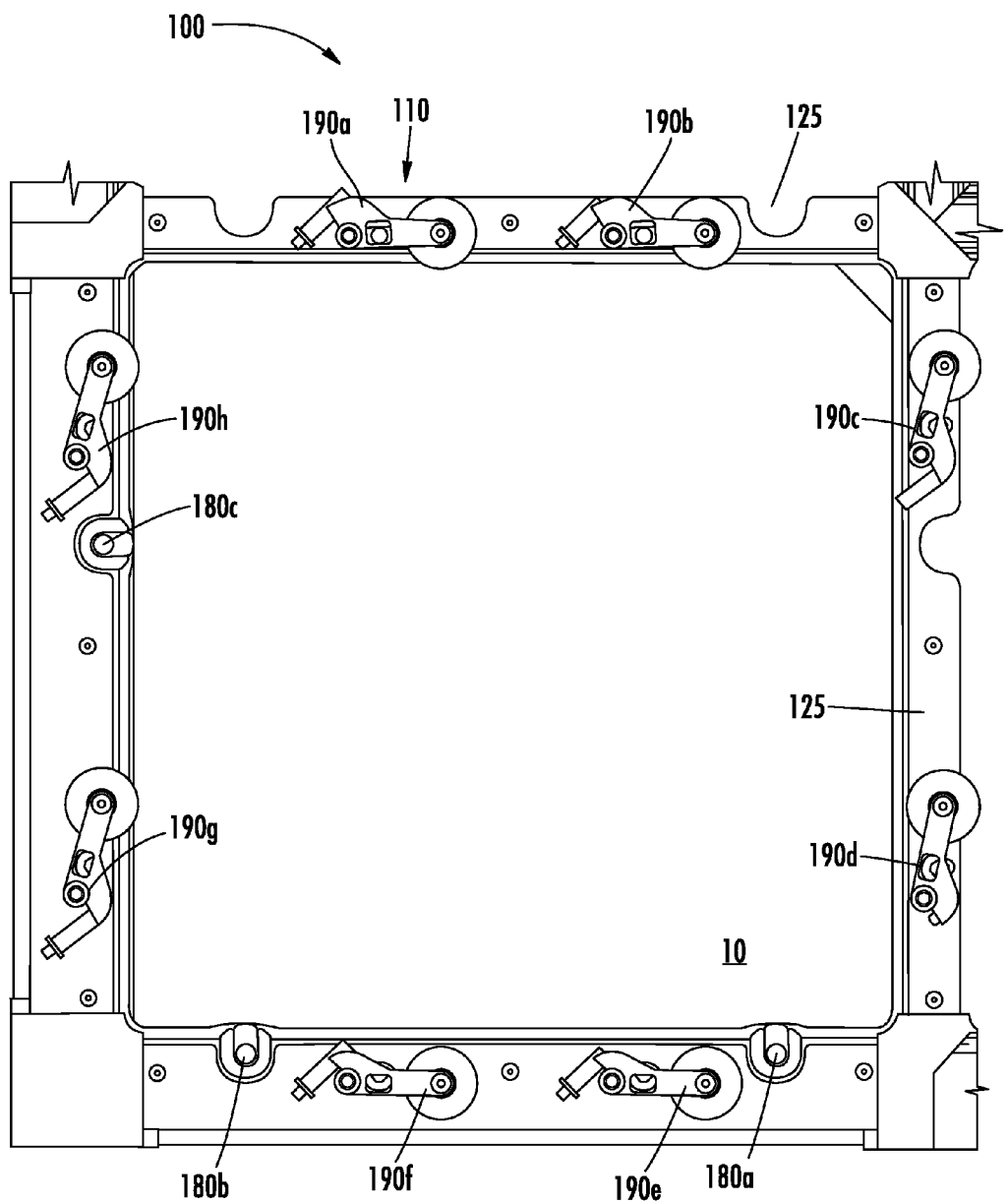
FIG. 8 shows a workpiece during the alignment process.

As seen in FIG. 8, movable projections 190a,b are then allowed to return to their naturally biased position, causing them to extend inside the perimeter of the cell 110. This action pushes the workpiece 10 toward the alignment pins 180a,b. Once the workpiece 10 contacts the alignment pins 180a,b, its movement in this direction ceases. The natural bias of the movable projections 190a,b holds the workpiece 10 against the alignment pins 180a,b.

As seen in FIG. 6, after movable projections 190a,b have ceased movement, movable projections 190c,d are allowed to return to their naturally biased position. This serves to push the workpiece 10, which is already aligned to alignment pins 180a,b toward alignment pin 180c. Once the workpiece 10 contacts the alignment pin 180c, its movement in this direction ceases. The natural bias of the movable projections 190c,d hold the workpiece 10 against the alignment pin 180c. In this way, the workpiece 10 is held in place without blocking or obscuring any portion of the workpiece 10.

To remove the workpiece 10 from the carrier 100, these steps may be executed in reverse order. In this case, movable projections 190c,d are actuated to overcome their natural biased positions, and movable projections 190g,h move the workpiece 10 away from alignment pin 180c. Subsequently, movable projections 190a,b are actuated to overcome their natural biased positions, and movable projections 190e,f move the workpiece 10 away from alignment pins 180a,b.

Although this disclosure describes a sequential operation where the workpiece 10 is first moved toward alignment pins 180a,b, and then toward alignment pin 180c, other embodiments are possible. For example, the workpiece 10 can be moved in both directions simultaneously. In another embodiment, the workpiece 10 is moved toward alignment pin 180c first, and then toward alignment pins 180a,b.

Similarly, the process of releasing the workpiece 10 may be different. In another embodiment, movable projections 190a-d are actuated simultaneously, so that workpiece moves away from all alignment pins 180a-c simultaneously. In another embodiment, movable projections 190a,b are actuated first, thereby pushing the workpiece 10 away from alignment pins 180a,b. The movable projections 190c,d are then actuated, moving the workpiece 10 away from alignment pin 180c.

In other words, the movable projections 190 can be actuated in any predetermined sequence.

Figure 9:
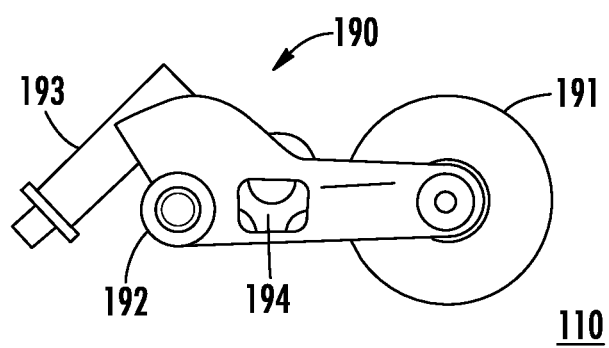
FIG. 9 is an enlarged view of the movable projection according to one embodiment.

The movable projections 190 can be actuated in a variety of ways. FIG. 9 shows an enlarged view of one embodiment of a movable projection 190. The movable projection 190 includes a rotatable wheel 191, which is pivotable about an axis located near one end of projection 190. The movable projection 190 is pivotable about a point 192. The opposite end of the projection 190 is attachable to a biasing member 193. The biasing member 193 causes the movable projection 190 to rotate about the point 192. The biasing member 193 may be a compliant spring mechanism that allows for irregularly shaped workpieces 10 to be used in the carrier 100. It also allows for expansion caused by thermal growth during processing, since the energy imparted on the workpiece 10, such as during implantation, may be significant and may cause parts of the workpiece 10 to grow at different rates. Biasing members 193 are also independent on each movable projection 190 allowing each one to be used independently. This may reduce hertzian stresses on the edge of each workpiece 10. Actuator 221 is the mechanical device that pushes up and down and causes movable projection 190 to pivot about point 192. Biasing member 193 then serves as the counteracting mechanism, allowing the movable projection 190 to return to a naturally biased position after actuator 221 is retracted from the opening 194. A spring stop that help capture the biasing member 193 may be located on the back side of biasing member 193. In some embodiments, the biasing member 193 can push the movable projection 190, while in other embodiments, the biasing member 193 pulls the movable projection 190. In one position, the movable projection 190, and specifically the wheel 191, extends into the cell 110. In the second position, the wheel 191 is retracted from the cell 110. Located in the movable projection 190 is an opening 194. This opening 194 is aligned to an aperture under the movable projection 190, through which an actuator may extend. When the actuator extends into this opening 194, it moves the movable projection 190 and holds it in a help position, different than its naturally biased position.

While FIG. 9 shows a wheel 191, other configurations of the movable projection 190 are also within the scope of the disclosure. For example, the wheel 191 may be replaced with a peg or other rigid member that does not need to rotate which performs the same function. This peg or other mechanism may still be connected to the biasing member 193. The surface of the wheel 191, peg, or other mechanism that contacts the workpiece 10 may be flat, angled, curved, or other shapes.

Figure 10A:
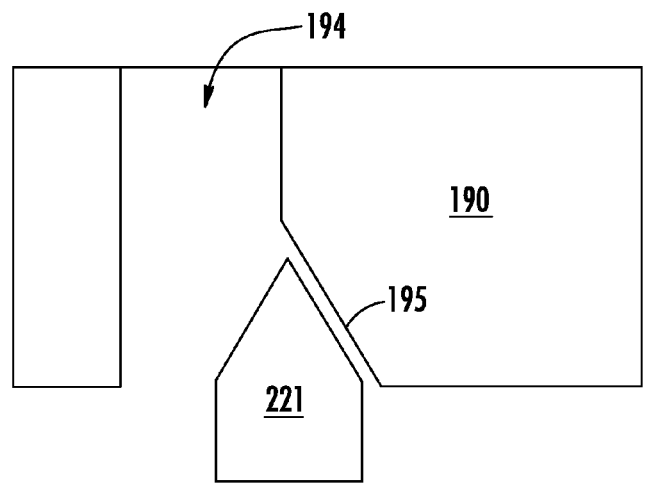
FIGS. 10A-C show the interaction between the actuator and the movable projection.
Figure 10B:
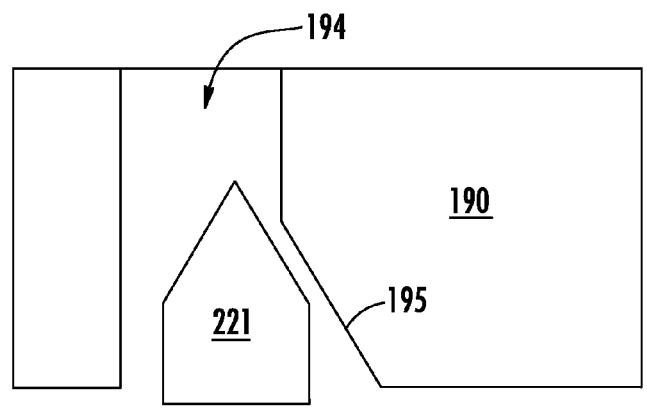
Figure 10C:
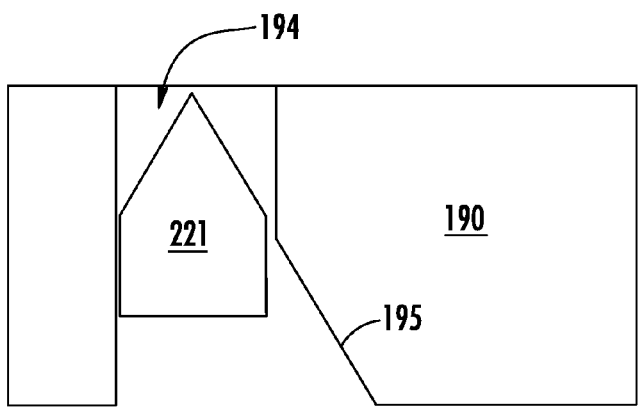

FIGS. 10A-C shows a cross-sectional view of the movable projection 190, showing the interaction between the actuator 221 and the opening 194. As can be seen in FIG. 10A, the actuator 221 is not exactly aligned to the opening 194 when the moveable projection 190 is in its naturally biased position. The opening 194 in the movable projection 190 has a sidewall having a downward facing ramp 195. As the actuator 221 moves upward through an aperture in the carrier 100, it travels along this ramp 195, causing the movable projection 190 to move away from its natural biased position, as seen in FIG. 10B. When the actuator 221 is fully extended, as shown in FIG. 10C, the movable projection 190 is in the held position.

Figure 11:
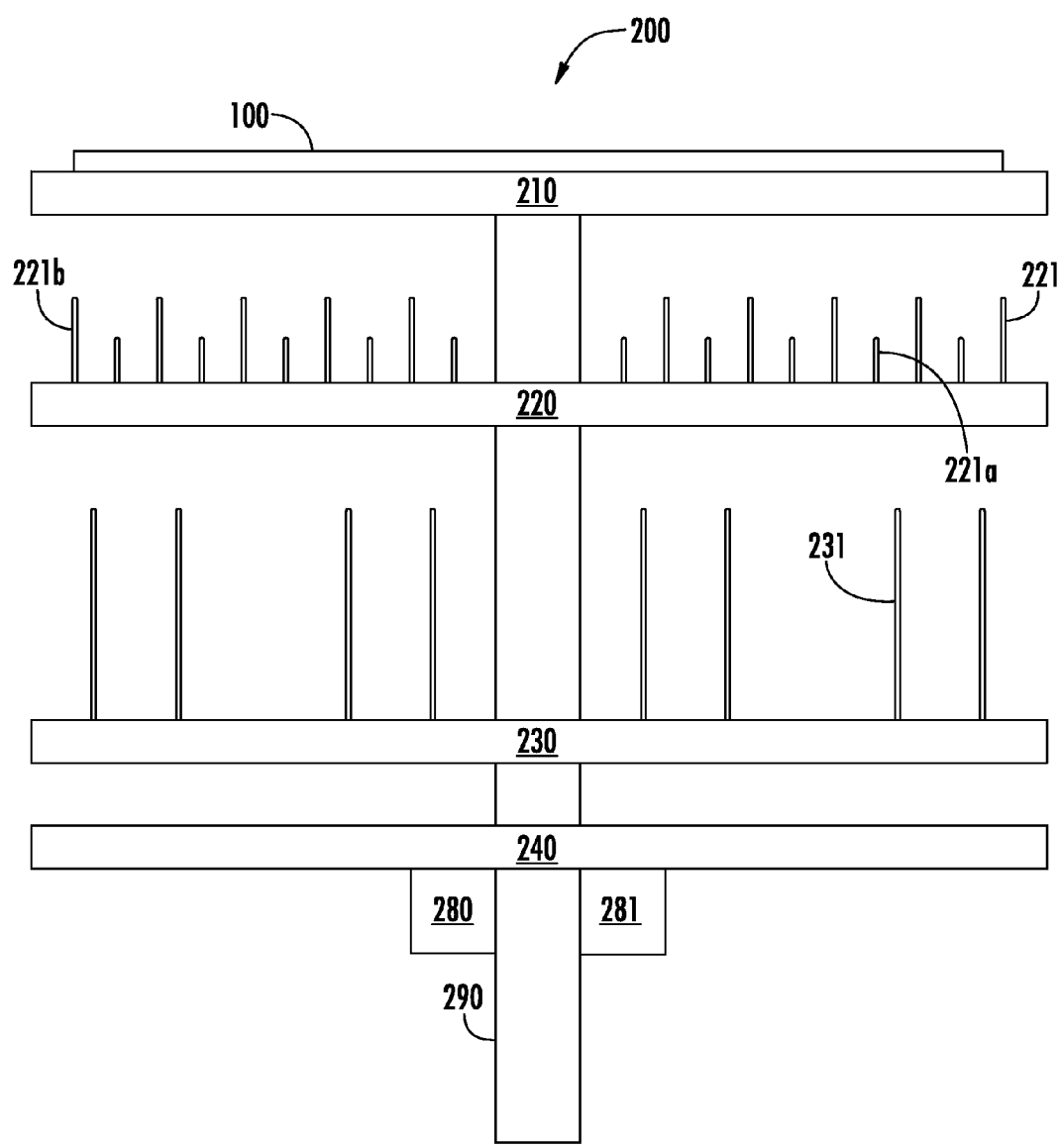
FIG. 11 shows an alignment apparatus that can be used with the carrier of FIG. 1.

FIG. 11 shows one possible alignment apparatus 200. This apparatus 200 can be used to lower the workpiece 10 onto the carrier 100, actuate the movable projections 190 in a predetermined sequence, and later, lift the workpiece from the carrier 100.

The apparatus 200 has a number of plates, some of which are stationary and others of which are movable. The top plate 210 is stationary and provides a platform on which the carrier 100 may be disposed. This top plate 210 may have a plurality of holes through which lift pins 231 and actuators 221 may pass. In other embodiments, a portion of the top plate 210, such as the middle portion, may be removed to allow a space where these lift pins 231 and actuators 221 may pass. The top plate 210 may also have a mechanism used to hold or secure the carrier 100 to the top plate 210. In one embodiment, this mechanism may be a set of magnets, which are aligned to magnetic portions located on the bottom of the carrier 100.

Positioned beneath the top plate 210 is a movable plate, known as the actuator plate 220. The actuator plate 220 is coupled to a linear actuator 280, which moves the actuator plate 220 up and down along the central shaft 290. Located on the upper surface of the actuator plate 220 and extending upwardly, is a plurality of actuators 221. These actuators 221 may be of various heights. In the case of two different heights, one set of actuators 221a are used to actuate the movable projections 190a,b and 190e,f of each cell 110 (see FIG. 6). These actuators are of a first height. A second set of actuators 221b are used to actuate the movable projections 190c,d and 190g,h of each cell 110. These actuators 221b are of a second height, which is greater than the first height. These actuators 221 pass through openings in the top plate 210, as described above. Other various height actuators may be employed to facilitate moving the workpiece to specific load, unload, clamp, offset, and rotational positions. This may be performed for processing, tailoring improvements, imaging for repeatability and accuracy verification, or teaching methods for robots, for example.

Beneath the actuator plate 220 is the lift plate 230. The top surface of the lift plate 230 has a plurality of upwardly extending lift pins 231, which are used to lift the workpieces 10 from the carrier 100. These lift pins 231 are located so as to contact the underside of the workpieces 10. As described above, each of the platens 160 (located in carrier 100) may have openings to allow these lift pins 231 to extend into the carrier 100 and lift the workpieces 10. This lift plate 230 is controlled by a linear actuator 281, which allows the lift plate 230 to move vertically along the central shaft 290. To accommodate these lift pins 231, actuator plate 220 may have openings therein to allow the lift pins 231 to pass through.

The alignment apparatus 200 may also have a lower plate 240, which is stationary and used for bearing and as support anchors.

Figure 12A:
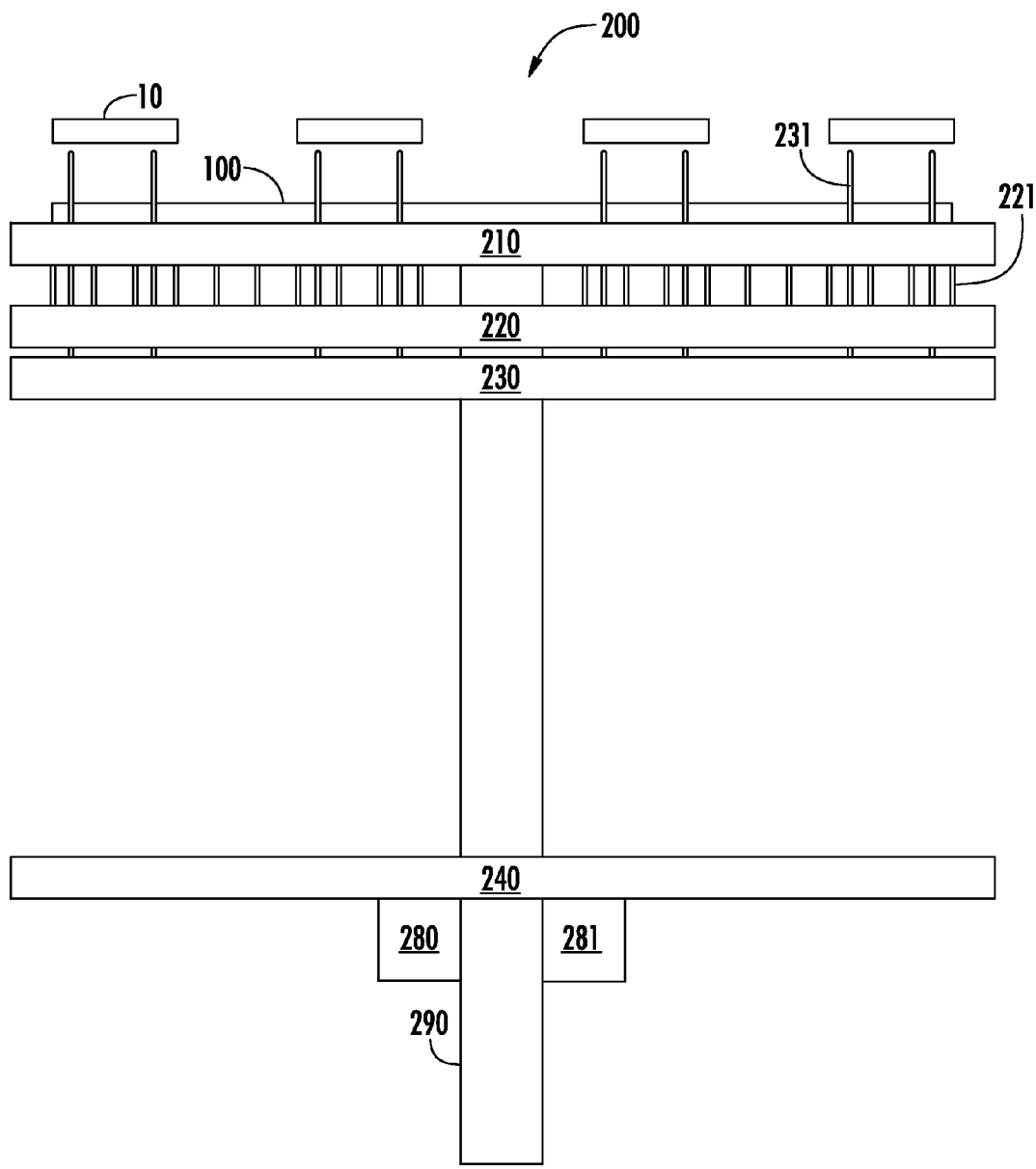
FIG. 12A-C show the alignment apparatus of FIG. 11 during various stages of execution.

In operation, as shown in FIG. 12A, the lift plate 230 is lifted toward the top plate 210, as is the actuator plate 220. The lift pins 231 extend through the carrier 100. A robot or other mechanism then loads a workpiece 10 on the set of lift pins 231 associated with each respective cell 110. In some embodiments, there are four lift pins 231 associated with each cell 110, although other numbers of lift pins 231 can extend through each cell.

Figure 12B:
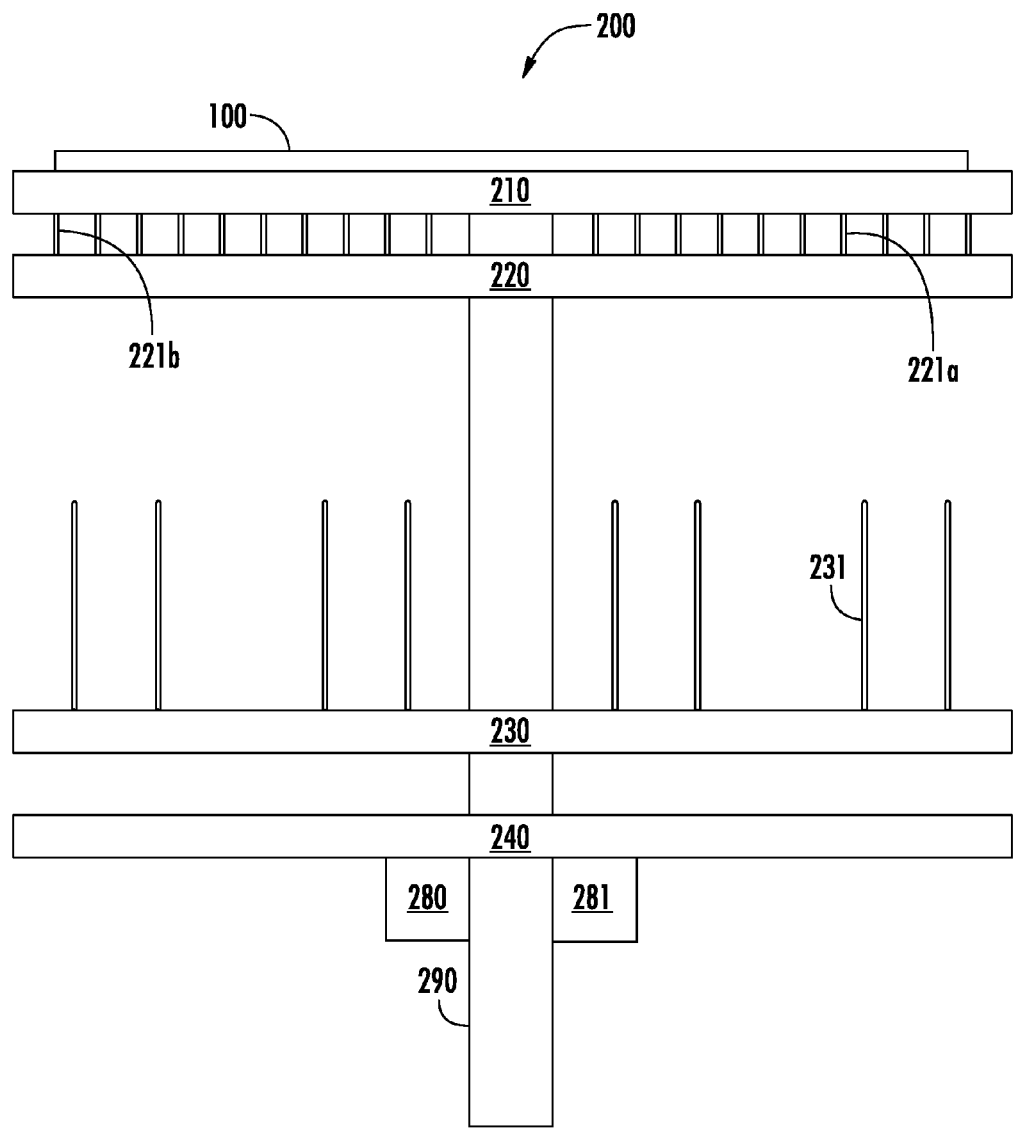

The lift plate 230 then descends as controlled by linear actuator 281, which allows the workpieces 10 to sit in their respective cells 110, as shown in FIG. 12B. In this view, the workpieces 10 are no longer visible, as they are sitting within the carrier 100. At this time, the actuator plate 220 is still positioned up toward the top plate 210, such that the actuators 221a,b are engaged with openings 194 in the movable projections 190, as shown in FIG. 10C.

Figure 12C:
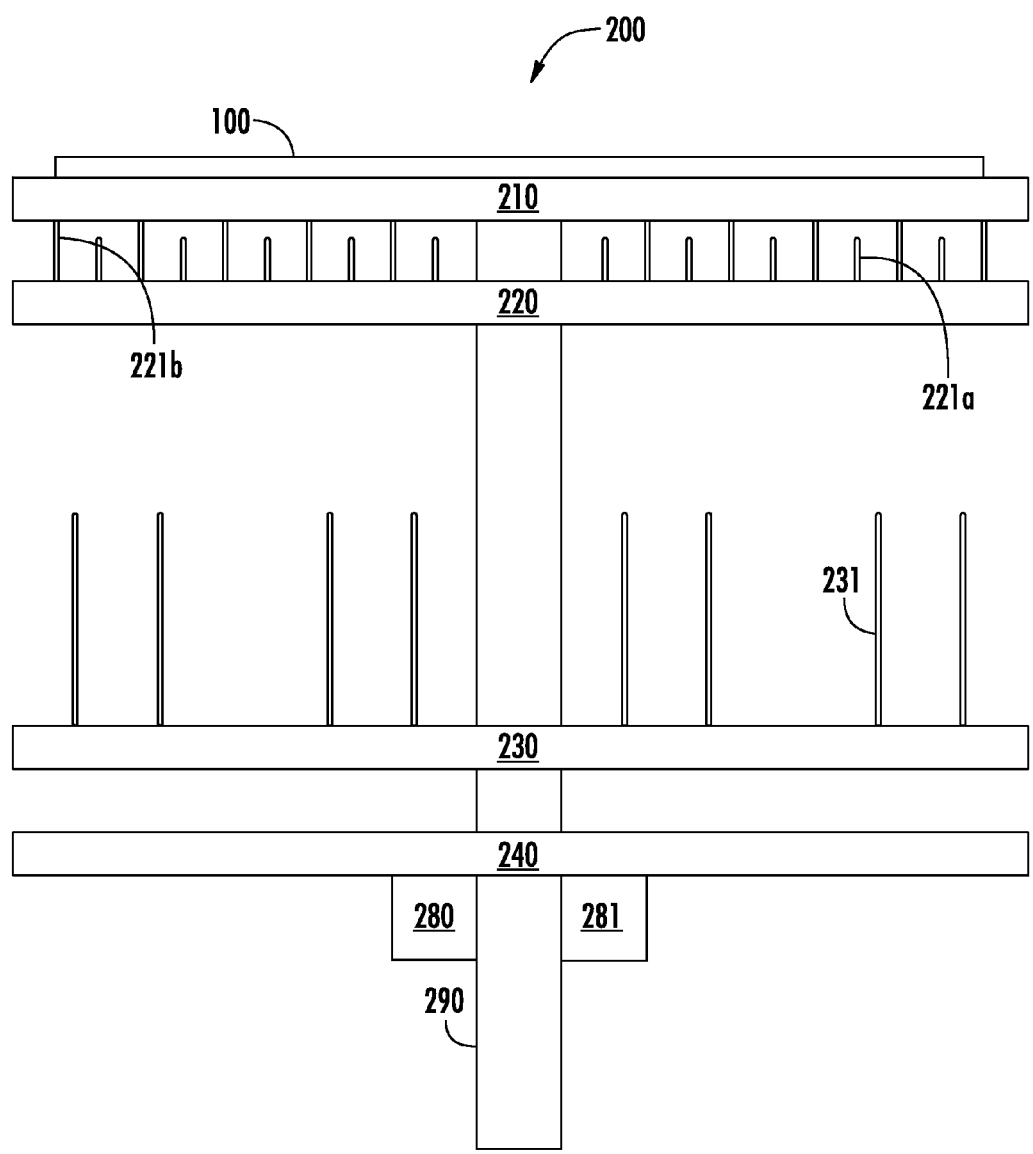

As the actuator plate 220 is moved downward, as seen in FIG. 12C, away from the top plate 210 and the carrier 100, the first set of actuators 221a, which contain shorter pins, disengages from the movable projections 190a,b and 190e,f (see FIGS. 6-8) first. This allows these projections 190a,b and 190e,f to move to their natural biased positions and moves the workpiece 10 against the alignment pins 180a,b, as shown in FIG. 8.

As the actuator plate 220 continues to move away from the top plate 210, as seen in FIG. 12C, the second set of actuators 221b, which are longer, disengages from the remaining movable projections 190c,d and 190 g,h. This allows the remaining movable projections 190c,d and 190g,h to return to their naturally biased positions. This movement causes the workpiece 10 to be moved against the alignment pin 180c (see FIG. 6). The time between the disengagement of the first set of actuators 221a and the second set of actuators 221b is determined based on the difference in height between these two sets of actuators 221a,b and the speed at which the actuator plate 220 moves (assuming that the actuator plate 220 moves at a constant speed). Of course, this time can be adjusted by using a non-linear speed profile for the actuator plate 220. This can be achieved by controlling the linear actuator 280 to slow the speed of the actuator plate 220 after the first set of actuators 221a have disengaged.

Performing two direction alignment in two separate steps may, in some embodiments, reduce workpiece breakage or workpiece jamming or misalignment in the cell. In other embodiments, the alignment in both directions is performed simultaneously.

In another embodiment, the actuator plate 220 can be implemented as two separate plates, where one plate has the first set of actuators 221a and the second plate has the second set of actuators 221b. These plates may be independently controlled by separate linear actuators, so that the actuators 221 can be moved in any desired sequence. This configuration allows different engagement and disengagement sequences.

As mentioned above, other embodiments are possible. For example, all actuators 221 may be the same height, since the alignment of the workpiece 10 occurs in both directions simultaneously.

Once the actuator plate 220 and lift plate 230 have been lowered, the workpieces are all aligned and clamped via the movable projections 190 (see FIG. 9) to their respective cells. Once the workpieces are clamped, the carrier 100 may be processed. The processing of the workpieces may include ion implantation, deposition, etching, or other processing steps, as are well known in the art. In one embodiment, masks, such as those shown in FIGS. 1-3, are placed on each respective cell prior to the processing of the workpieces. This may be done using a robotic mechanism. In another embodiment, no mask is used during the processing. The carrier 100 may be moved to a different location for processing, such as ion implantation, than where the workpiece alignment occurs. This processing may involve flipping or rotating the carrier 100. The embodiments disclosed herein may retain the workpieces 10 in the cells 110 during this moving, flipping, rotating, or other motion.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A system for holding at least one workpiece, comprising:
   a carrier, comprising
      a plurality of walls arranged as a grid, where four of said walls define a perimeter of a cell, wherein said cell is configured to hold a workpiece;
      one alignment pin located along a first side of said perimeter and one alignment pin located along a second side of said perimeter, said second side adjacent and perpendicular to said first side;
      movable projections positioned along a third side and a fourth side of said perimeter of said cell, wherein said third side and said fourth side are opposite said first side and said second side, respectively, and wherein said movable projections each comprise an opening; and
      a biasing member in communication with each of said movable projections such that said movable projections are naturally biased into said perimeter;
   an actuator configured to enter said opening in each of said moveable projections, said actuator causing movement of said moveable projection away from said perimeter to a held position; and
   an apparatus comprising:
      a top plate on which said carrier is disposed; and
      a movable actuator plate, in communication with a first linear actuator, having said actuators extending upward therefrom;
   wherein a first group of said actuators has a first height and a second group of said actuators has a second height, less than said first height.

2. The system of claim 1, further comprising additional movable projections positioned along said first side and second side, each in communication with an additional biasing member such that said additional movable projections are naturally biased away from said perimeter.

3. The system of claim 2, wherein said additional movable projections each comprise an opening through which a respective actuator enters, said respective actuator causing movement of one of said additional moveable projections toward said perimeter to a held position of said additional moveable projections.

4. The system of claim 2, further comprising a second cell adjacent to said first side, wherein said additional movable projections along said first side serve as said movable projections along said third side in said second cell.

5. The system of claim 1, further comprising a platen located at the bottom of said cell, said platen comprising at least one opening through which a lift pin is extended to remove said workpiece from said cell.

6. The system of claim 1, wherein said apparatus further comprises:
   a movable lift plate, in communication with a second linear actuator, comprising lift pins extending therefrom to lift said workpiece from said carrier.

7. The system of claim 1, wherein one of said first group of said actuators is aligned with said opening in said movable projection of said fourth side, and one of said second group of said actuators is aligned with said opening in said movable projection on said third side, such that when said movable actuator plate is moved away from said carrier, said movable projections on said third side become disengaged from said second group of said actuators before said movable projections on said fourth side become disengaged from said first group of said actuators.

8. A carrier for holding one or more workpieces, comprising:
- a plurality of walls arranged as a grid, where four of said walls define a perimeter of a cell, wherein said cell is configured to hold a workpiece;
- one alignment pin located along a first side of said perimeter and one alignment pin located along a second side of said perimeter, said second side adjacent and perpendicular to said first side;
- movable projections positioned along a third side and a fourth side of said perimeter of said cell, wherein said third side and said fourth side are opposite said first side and said second side, respectively, and wherein said movable projections have a held position and a naturally biased position;
- a biasing member in communication with each of said movable projections such that said movable projections are naturally biased into said perimeter when in said naturally biased position;
- additional movable projections positioned along the first side and second side, each in communication with an additional biasing member such that said additional movable projections, in said naturally biased position, are naturally biased away from said perimeter; and
- a second cell adjacent to said first side, wherein said additional movable projections along said first side serve as said movable projections along said third side in said second cell.

9. The carrier of claim 8, wherein said additional movable projections each comprise an opening through which an actuator enters, said actuator causing movement of said additional moveable projections toward said perimeter to a held position for said additional moveable projections.

10. The carrier of claim 8, further comprising a platen located at the bottom of said cell, said platen comprising at least one opening through which a lift pin is extended to remove said workpiece from said cell.

11. A method of aligning a workpiece within a carrier, where said carrier comprises at least one cell and said cell comprises an alignment pin on a first side and an alignment pin on a second side, said second side adjacent and perpendicular to said first side, comprising:
- holding a first movable projection located on a third side, opposite said first side, and a second movable projection located on a fourth side, opposite said second side, each in a held position outside a perimeter of said cell, wherein each of said movable projections comprises an opening through which an actuator enters, said actuator causing movement of said moveable projections away from said perimeter to said held position;
- lowering a workpiece into said cell; and
- moving a plate comprising a plurality of said actuators extending therefrom away from said carrier, where each of said actuators is aligned with a respective one of said openings, such that while one of said actuators is in said respective opening, said movable projection is kept in said held position, and when said actuator is removed from said opening, said movable projection moves to a naturally biased position within said perimeter,
- wherein said plurality of actuators comprises a first group of actuators having a first height, and a second group of actuators having a second height, less than said first height, and one of said first group is aligned with said opening in said second movable projection, and one of said second group is aligned with said opening in said first movable projection,
- such that, as said plate moves away from said carrier, said first movable projection moves to said naturally biased position before said second movable projection moves to said naturally biased position, so that said workpiece is moved toward said first alignment pin and then moved toward said second alignment pin.

12. The method of claim 11, wherein said lowering step comprises:
- placing said workpiece on one or more lift pins; moving a plate, disposed beneath said carrier, comprising said lift pins extending therefrom, away from said carrier, such that said workpiece is lowered into said cell.

* * * * *